United States Patent [19]

Stern et al.

[11] Patent Number: 5,255,241
[45] Date of Patent: Oct. 19, 1993

[54] APPARATUS FOR INTELLIGENT REDUCTION OF WORST CASE POWER IN MEMORY SYSTEMS

[75] Inventors: Richard M. Stern; Floyd D. Kendrick, Jr., both of Santa Clara; Jordan R. Silver, San Jose, all of Calif.

[73] Assignee: Tandem Computers Incorporated, Cupertino, Calif.

[21] Appl. No.: 703,228

[22] Filed: May 20, 1991

[51] Int. Cl.$^5$ .............................................. G11B 17/30
[52] U.S. Cl. ...................................... 365/226; 365/233; 365/236; 365/193; 365/195
[58] Field of Search ............ 365/226, 233, 236, 230.02, 365/193, 195, 196

[56] References Cited

U.S. PATENT DOCUMENTS

| | | | |
|---|---|---|---|
| 4,280,199 | 7/1981 | Osakabe et al. | 365/236 |
| 4,873,666 | 10/1989 | Lefebvre et al. | 365/236 |
| 4,953,128 | 8/1990 | Kawai et al. | 365/236 |
| 4,985,868 | 1/1991 | Nakano et al. | 365/193 |

FOREIGN PATENT DOCUMENTS

| | | | |
|---|---|---|---|
| 1231535 | 5/1986 | U.S.S.R. | 365/236 |
| 1575238 | 6/1990 | U.S.S.R. | 365/236 |

Primary Examiner—Steven Mottola
Assistant Examiner—R. A. Ratliff
Attorney, Agent, or Firm—Townsend and Townsend Khourie and Crew

[57] ABSTRACT

A memory system is implemented by an array of large scale integrated dynamic random access memory elements. The memory elements are of a type that permit data way word storage on a page basis, each page being defined on a row boundary. Discovering that excess power consumption by the memory can result from successive memory operations made back-to-back to different page locations, the present invention provides counter means to count each immediately successive different page memory operations so that, when that count matches a maximum count, memory operations are stalled for a period of time.

19 Claims, 3 Drawing Sheets

APPARATUS FOR INTELLIGENT REDUCTION OF WORST CASE POWER IN MEMORY SYSTEMS

BACKGROUND OF THE INVENTION

The present invention is directed generally to memory systems for use in data processing equipment, and more particularly to apparatus for preventing excessive power consumption by the memory system.

Recent advances in very large-scale (VLSI) integrated circuitry fabrication has resulted in memory elements in the form of integrated circuit "chips" capable of storing large amounts of digital data. For example, there is now available on the market today VLSI memory element chips (typically, in the form of dynamic random access memory (DRAM) capable of storing one megabits (1,048,576), four megabits (4,194,304), and even sixteen megabits (16,777,216) of digital information. Typically, these memory element chips are organized to store N words by one bit. They are often used in multiples of M chips to form an array that provides N words by M bits of storage.

It is often advantageous to organize memory systems formed from such memory elements on a page basis; that is, contiguous groups of memory locations form one page, usually organized on a row address boundary that is in turn established by the memory element used. Memory accesses to different memory locations within each page are accompanied by column address strobes which signify presence of a memory location address at memory address inputs of the elements. A memory access to a different page of memory will cause occurrence of both a row address strobe signal and the column address strobe signal.

It has been discovered that, at high speed operation, excessive power consumption can occur in memory systems implemented using such VLSI memory elements, particularly when successive, back-to-back memory operations to different pages are performed. Successive back-to-back different page writes will tend to cause a charge build-up from the resulting string of row address strobes needed to make such different page writes. This string of row address strobes will tend to result in an increased current draw. Thus, it is believed that the worst-case power consumption situation will occur when successive different back-to-back write operations are performed.

This presents a good news—bad news situation. The good news is that multiple different page back-to-back write operations are believed to be infrequent. The bad news is that there is the possibility that a situation will arise, however infrequent, resulting in multiple back-to-back different page write operations. This, in turn, can cause the memory system to consume power beyond a power supply system's capability, resulting in a power shut-down to protect the system.

One solution to the problem can be to provide power supply systems designed to handle the excess power consumed during these infrequent back-to-back different page writes. However, this solution results in heavier, bulkier, and more expensive power supplies. Further, in the event that an existing data processing system is to be upgraded with more and newer memory of the type discussed above, it may not be an easy task to also upgrade the power supply capability without incurring undue cost.

There is a more elegant solution.

SUMMARY OF THE INVENTION

Accordingly, the present invention provides another approach: Memory operations are monitored, and certain types of memory operations are counted. When the count of the monitored memory operations reaches a predetermined maximum, indicating a possible power consumption build-up occurring, the subsequent memory operation is delayed a predetermined period of time, allowing the build-up to dissipate.

The preferred embodiment of the invention is used in connection with a processing system that includes a processor unit coupled to a memory storage system constructed from a plurality of VLSI memory elements arranged to form an array capable of storing N words, each M bits wide. A memory controller provides the necessary memory control signals in response to memory access requests (e.g., reads, writes, etc.) from the processor unit.

Such memory access requests are made when a memory available signal, provided by the memory controller, is present. In response to received memory access requests from the data processor, the memory controller provides the necessary address, row address strobe (RAS), and column address strobe (CAS), and write enable (WE) signals to store or retrieve data in the memory array. In the implementation of the memory array, the RAS signal identifies a demarkation between groups of memory locations (i.e., pages). Thus, each time a memory operation references a page different from that of an immediately preceding memory operation, a RAS signal is provided.

In the preferred embodiment of the invention, the certain types of memory operations that are counted are successive memory write operations of the processor unit to memory pages different from the one of each immediately preceding write operation.

Implemented as part of the memory controller, the present invention includes a counter circuit that operates to count occurrences of memory operations to different pages. Decode circuitry monitors the count obtained by the counter circuit, and when that count reaches a predetermined maximum, the decode circuitry operates to inhibit presence of the memory available signal, thereby temporarily prohibiting any further memory requests by the processor unit. An idle counter circuit continuously counts a system clock, and when the idle counter circuit rolls over from its maximum count to ZERO, a reset signal is produced to reset the counter circuit, permitting the memory available signal to issue.

In the preferred embodiment of the invention the monitored memory system is organized as outlined above: Pages of memory (i.e., predetermined groups of memory locations) are organized on row address boundaries. Thus, each assertion of a RAS signal denotes a memory reference to a memory page different from the preceding reference. Therefore, it is convenient to have the counter circuit operate to count assertions of the RAS signal for every write request. Counter control circuitry will reset the counter circuit back to its initial count when the idle counter rolls over from its maximum count.

An additional counter is provided in an alternate embodiment of the invention to also monitor the CAS signal, in the same manner as the RAS signal, to prevent excessive memory operations, without reference to different pages, from causing excessive power consumption.

Further embodiments of the invention permit the various counter circuits to be pre-set with some starting value to permit the number of monitored memory operations that occur before action is taken (e.g., withholding of the memory available signal) to be varied.

A number of advantages flow from the present invention. First, the present invention is an elegant and relatively inexpensive alternative to providing heavier, bulkier, and more expensive power supplies to counter infrequent excessive power demands made by memory systems.

Further, the embodiments of the invention that permit programmed scalers to be used to set counts and time delays customized to the particular size of the memory array permits memory systems to be designed with the capability of later expansion. That is, in the event the memory array is expanded, the invention may be programmed to expand along therewith.

These and other advantages and aspects of the invention will become apparent to those skilled in the art upon reading of the following details and description of the invention, which should be taken in conjunction with the accompanying drawings.

DETAILED DESCRIPTION OF THE DRAWINGS

Figure 1:
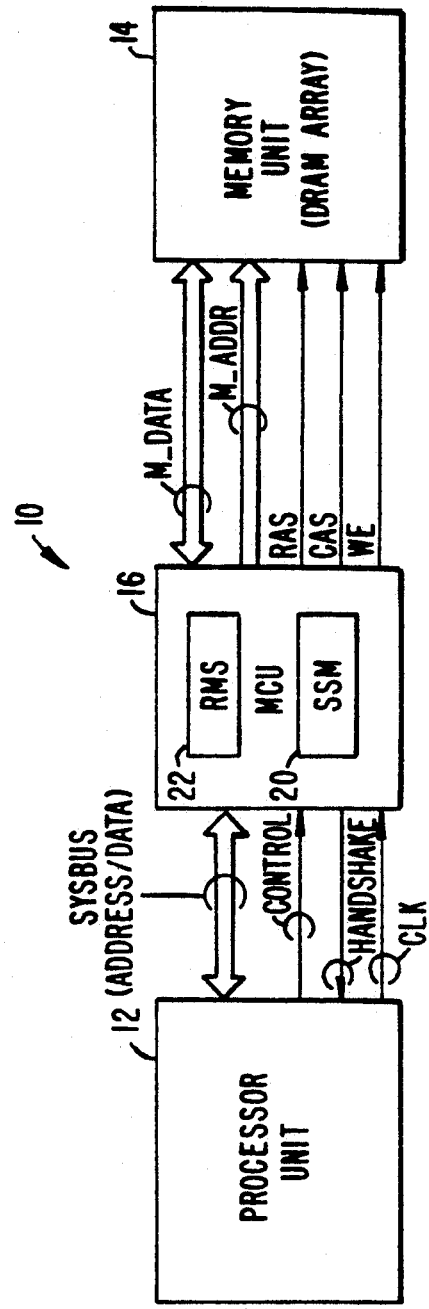
FIG. 1 is a simplified block diagram of a data processing system incorporating a memory array monitored by the present invention.

Turning now to FIG. 1, there is illustrated a data processing system, designated generally with the reference numeral 10. As illustrated, the data processing system 10 includes a processor unit 12 coupled to a memory unit 14 by a memory control unit (MCU) 16. The MCU 16 operates, in response to memory requests (e.g., requests for data storage or retrieval) from the processor unit 12 to control access of the memory unit 14. For this purpose, the MCU is of generally conventional design, except for the inclusion of the present invention, which will be discussed below.

As will be seen, the memory unit 14 is implemented using a number of VLSI memory elements, each N by one bit in size. The memory elements are then arranged in arrays to form memory locations that are each M bits in size. The memory unit 14 operates in generally conventional fashion: To store data a memory location is identified by an address that is communicated on a memory address (M_ADDR) bus, accompanied by the data to be stored (written) on the memory data (M_DATA) bus, and a write enable (WE) signal that identifies a write signals are generated to set the address on the M_ADDR bus in the memory unit 14. In the event the write is to a memory page different from that last referenced, the row address is first communicated on the M_ADDR bus, accompanied by the RAS signal, followed by communication of the column address and the CAS signal. If the write is to a memory page that was referenced in an immediately preceding memory operation, only the column address and accompanying CAS signal is needed.

The MCU 16 includes a system state machine (SSM) that is responsible for deciphering and acting upon the memory requests issued by the processor unit 12, and a RAM memory state machine (RMS) 22 which operates in conventional fashion to control the memory unit 14, including the generation of RAS, the CAS, and WE signals.

The SSM 20 handles the hand-shaking between the MCU 16 and the processor unit 12, receiving data and address signals that are communicated on a system bus (SYSBUS) in time-shared fashion, together with control signals communicated on a CONTROL bus. The MCU sends back various HANDSHAKE signals to the processor unit 12, including a "MEMORY AVAILABLE" signal (FIGS. 3 and 4) to the processor unit 12 to indicate the availability of the MCU 16 to handle memory operation requests of the processor unit 12. Absence of the MEMORY AVAILABLE signal operates to forestall any further memory requests issuing from the processor unit 12 until re-appearance of MEMORY AVAILABLE. (In the data processing system that implements the present invention, the MEMORY AVAILABLE signal is an internal signal that implements a handshake colloquy to inform the processor unit 12 that memory requests should be withheld. For reasons of clarity, however, the MEMORY AVAILABLE is used here to symbolically represent that handshake colloquy. The absence of MEMORY AVAILABLE actually extends the current request until the MCU 16 determines that it is safe to proceed.)

Preferably, the memory unit 14 is configured to form a DRAM array capable of storing 32M bytes of data with the ability of being expanded by an additional 96 M bytes to 128 M bytes of storage. It will be evident to those skilled in the art that the particular numbers can vary, and in fact, with proper design, can be made to far exceed 128 M bytes of data storage.

The DRAM array forming the memory unit 14 uses Fast Page Mode 4,194,304-bit (4,194,304-word by 1-bit) dynamic RAM memory elements manufactured by Mitsubishi Electric Corporation, and sold under the part numbers M5M44100P, J, L-8-10. These are 4 M (4,194,304) word by 1-bit dynamic RAMs. The array is arranged in pairs of banks, each bank containing 39 individual DRAMs. One bank is the "odd" bank, the other the "even" bank, for overlapped accesses. Word organization is 32 bits of data and 7 bits of error-correcting code (ECC), for a total of 39 bits per word and ECC. Thus, each bank (containing 39 DRAMs) provides storage for four M words and associated ECC.

Figure 2:
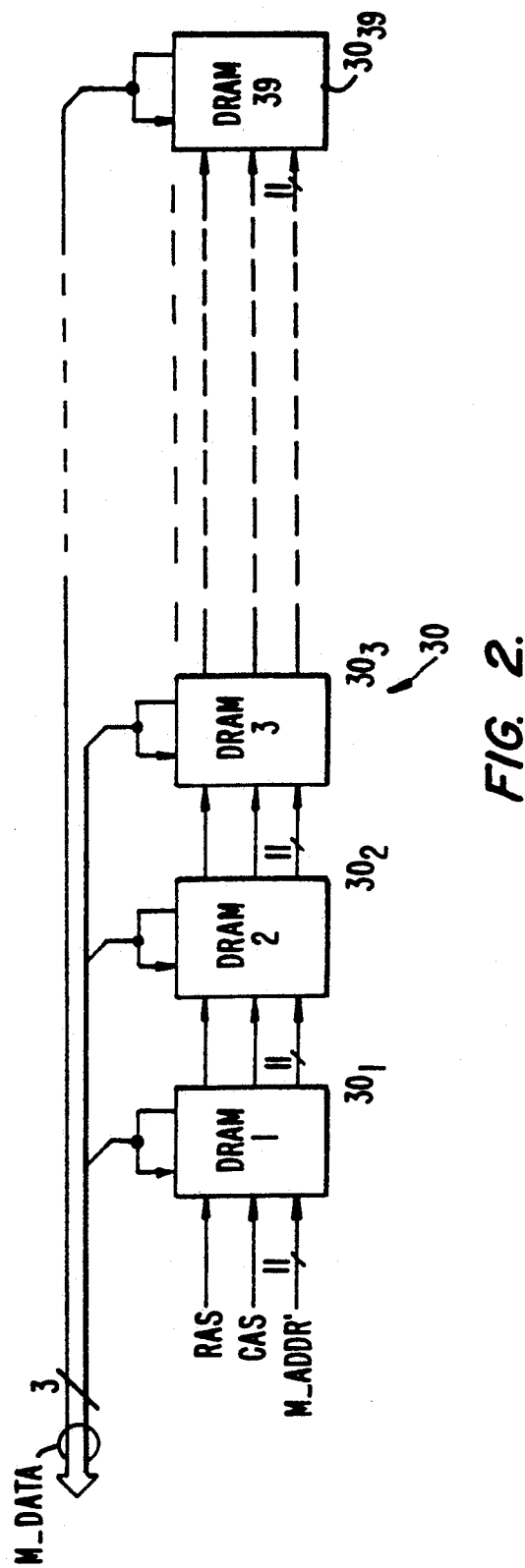
FIG. 2 is a simplified block diagram of a portion of the memory array shown in FIG. 1 illustrating use of DRAM elements.

Illustrated in FIG. 2, in simplified form, is one such bank of DRAM memory elements, designated generally by the reference numeral 30. As shown, the bank 30 of DRAM memory elements contains 39 DRAMs, $30_1$, $30_2$, ... $30_{39}$. The RAS and CAS signals from the MCU 16 are communicated (typically, in actual implementation, in negative logic form as $\overline{RAS}$ and $\overline{CAS}$) to the row and column strobe inputs of each of the DRAMs. The 11-bit M ADDR bus is also communicated to each of the DRAMs for addressing a one bit memory location in each DRAM. Finally, the $M_{13}$ DATA bus communicates 39 bits of data, one bit per DRAM, to the DRAM memory elements 30. Each of the 39 signal lines forming the M_DATA bus connects to the 1-bit data input and the data output terminals of each of the DRAMs $30_1, 30_2, \ldots, 30_{39}$. The data output of each DRAM has tri-state output circuitry (not shown), permitting tri-state, bi-directional operation of the M_DATA bus in conventional fashion.

The design of the DRAM memory elements themselves used permits page mode addressing. By this it is meant that pages of data (2 K words) are defined on a row boundary. Thus, to move from one page to another requires occurrence, or at least some change of state—depending upon actual design of the DRAM—of the RAS signal. While in one page, only the CAS signal is used to access different memory locations.

As indicated above, excessive power consumption can be created by multiple, back-to-back memory operations to different pages. For example, assume a situation in which repetitive write operations are being made alternately to pages P and P+1 so that data is written to page P, then to page P+1, followed by a write to page P, then page P+1, and so on. This is exhibited by a change in state of the RAS signal with every memory access. In turn, the situation will cause a build-up of memory power consumption that can exceed design criteria for power supplies. While it may be an infrequent situation, it is one that can occur and, regardless of how infrequent, should be taken into account when designing reliable data processing systems.

Figure 3:
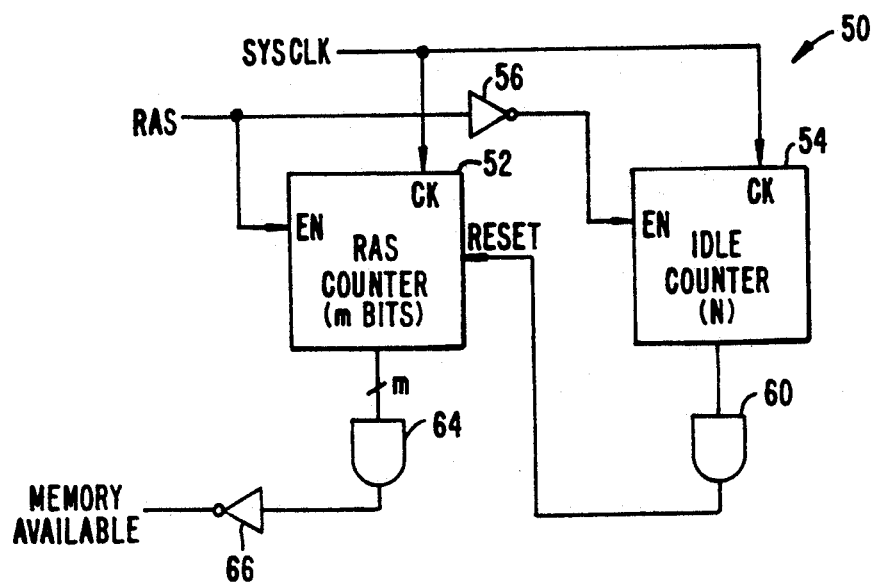
FIG. 3 is a simplified block diagram of the present invention.

The approach of the present invention to avoid such excessive power consumption conditions by monitoring memory operations. In simplified form the approach of the present invention is illustrated in FIG. 3. FIG. 3 shows a monitor circuit 50 comprising an M-bit RAS counter 52, and an N-bit idle counter 54. Both counters 52, 54 receive at their clock (CK) inputs a system clock (SYSCK). The RAS counter 52 is enabled, for counting SYSCLK, by the RAS signal. The idle counter 54 receives the complement of the RAS signal, via the INVERTER 56, and is therefore enabled for counting SYSCLK by the absence of the RAS signal. (More typically some derivation of the RAS signal may be more convenient; or, as implemented by the assignee of the present invention, a pulse (SETRAS-not shown) used to create the RAS signal can be used).

The idle counter 54 will increment with each pulse of SYSCLK when the RAS signal is not present. (In this implementation, the RAS signal is a pulse; each memory operation to a page of memory different from that referenced in the previous memory operation is preceded, or accompanied, by the RAS signal). The output of the idle counter 54 is applied to a decode circuit in the form of an AND gate 60 which functions to decode the maximum count (i.e., all ONE) of the idle counter 54. The output of the AND gate 60 forms a RESET signal that is applied to the RAS counter 52 to reset it.

The M-bit output of the RAS counter is received by an AND gate configuration 64 to produce a MEMORY AVAILABLE signal (used to help form or condition the HANDSHAKE signals that are communicated from the MCU 16 to the processor unit 12, as explained above—FIG. 1) via inverter 66 when the RAS counter has reached its maximum M-bit count (i.e., all ONEs).

Taking together the data processing system 10 of FIG. 1 and the monitor circuit 50 of FIG. 3 (which is formed as a part of the MCU 16), the operation of the monitor circuit 60 is generally as follows: Whenever the processor unit 12 issues a memory request (e.g., a read data, or a write data request, the MCU 16 will generate the necessary control signals, i.e., the RAS, CAS, and WE signals, as necessary, accompanying them with address signals on the M_ADDR bus. Data is transmitted on or received on the M_DATA bus. When data is to be written to or read from a page different from that of the last memory operation, the RMS 22 of the MCU 16 will generate a RAS signal. Each RAS signal (e.g., rising edge) is counted by the RAS counter 52. If the memory operation generating the RAS signal is followed by a memory operation to that same page, another RAS is not generated because it is not needed.

However, assume now that successive, back-to-back write operations are being made to different pages, with no intervening other memory operations. The RAS counter will count each RAS signal until its maximum count (as will be seen, the preferred maximum count is 16) is reached, or until the idle counter rolls over to reset the RAS counter 52. The RAS counter 52 will stop at its maximum count. While the RAS counter is in any state other than its maximum count (all ONEs), the MEMORY AVAILABLE signal is asserted, indirectly signifying to the processor unit 12 (FIG. 1) that the MCU 16 is capable of receiving and acting upon additional memory requests. However, when the RAS counter 52 reaches its maximum count, the MEMORY AVAILABLE signal will be removed (i.e., deasserted), and the processor unit 12 is ultimately informed that the MCU 16 will no longer handle memory requests. Accordingly, the processor unit 12 will hold off any further memory access request until the MEMORY AVAILABLE signal is again asserted.

In the meantime, however, the idle counter 54 continues to count until it reaches its maximum count. When the maximum count is achieved, the RESET signal is generated via the AND gate 60 and the OR gate 62, resetting the RAS counter to an initial count (other than the maximum count), causing the MEMORY AVAILABLE signal to be asserted. The MCU 16 is now in a condition to handle further memory requests from the processor unit 12. However, the monitor unit 50 has acted in the face of a string of successive write operations to different pages by slowing down, in effect, page changes every M writes.

It should be noted that the RAS and idle counters 52, 54 are not synchronous insofar as when counting begins; that is, the period of time that the MEMORY AVAILABLE signal is deasserted depends upon the count of the idle counter 54 when a string of different page write operations are initiated. For example, assume that the processor unit 12 begins a string of memory write operations, each to a different page of memory. The first number of memory write operations will go forward—until the RAS counter 52 reaches its maximum count. The MEMORY AVAILABLE signal will be de-asserted, causing the processor unit to hold any further write requests. The RAS signal is halted, enabling the idle counter to count its remaining states to its maximum, resetting the RAS counter 52, and causing assertion of the MEMORY AVAILABLE signal. However, because of the asynchronous relation between the RAS and idle counters 52, 54, this remaining number of counts can be anything. Thereafter, if the string of back-to-back write operations to different pages continues, the periods of MEMORY AVAILABLE deassertion will be constant and determinant.

Figure 4:
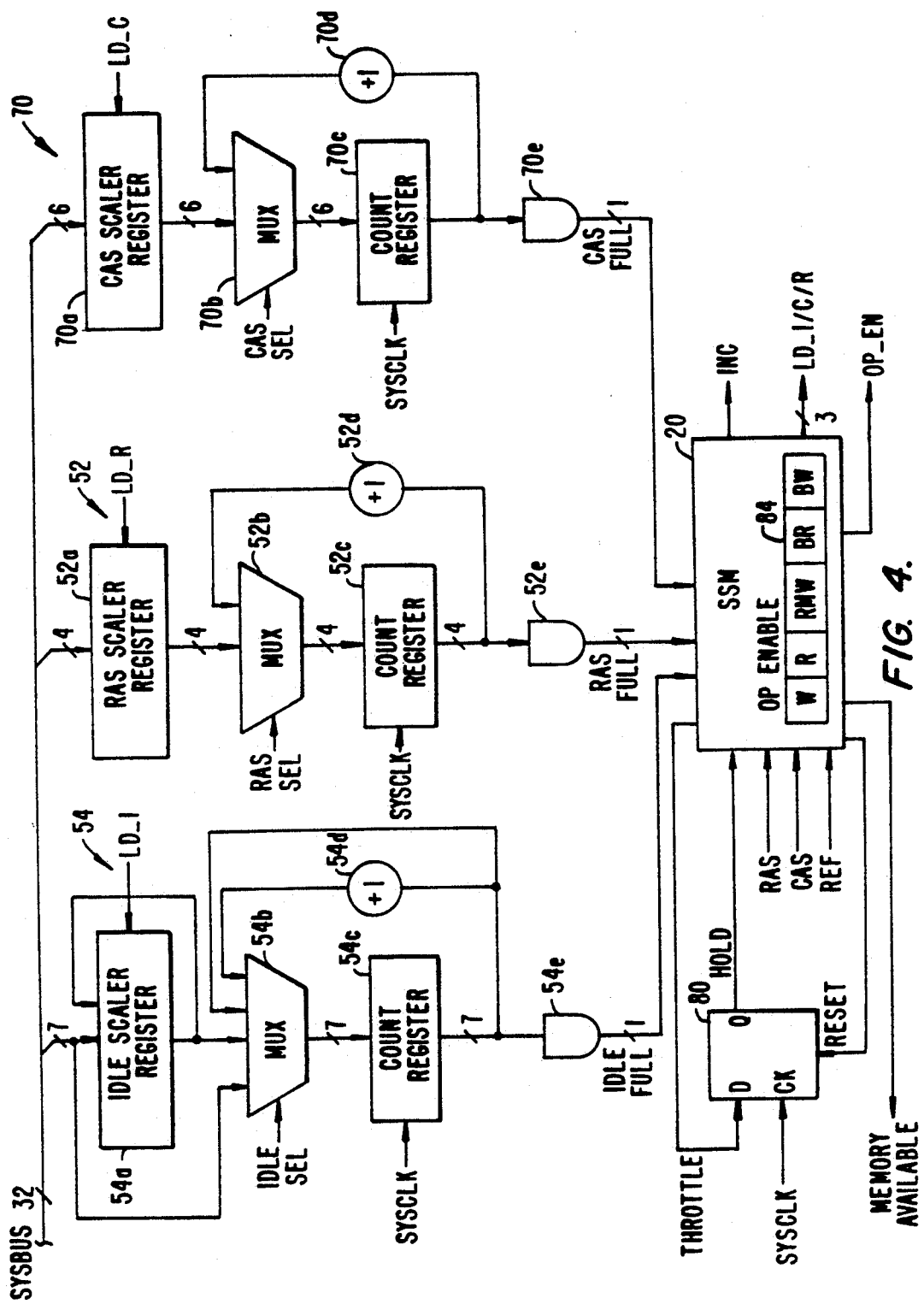
FIG. 4 is a detailed illustration of the present invention, illustrating alternate embodiments.

Turning now to FIG. 4, there is illustrated the preferred embodiment of the invention, showing the RAS and idle counters 52, 54 in greater detail. FIG. 4 also illustrates several alternate embodiments of the invention, including a CAS counter 70. The RAS, idle, and CAS counters 52, 54, 70 are of substantially identical design, except for width. (Certain data paths shown in the implementation of the idle counter 54 are not shown in RAS and CAS counters 52, 70 for reasons of clarity—notwithstanding the fact that such data paths are, in fact, present.) Accordingly, a discussion of the design of the idle counter 54 will apply equally to the RAS and CAS counters 52, 70, unless noted otherwise.

Referring then to the idle counter 54, it is illustrated as comprising a 7-bit series path between the 32-bit SYSBUS and the SSM 20 this is formed by an idle scaler register 54a, a multiplexer (MUX) 54b, a count register 54c, and a 7 input AND gate 54e.

The idle scaler register 54a and loads 7 bits of information from the SYSBUS. The 7-bit content of the idle scaler register 54a is applied to the MUX 54b, which also receives 7 bits of information from the SYSBUS, as well as the output of the count register 54c and an incrementer 54d. In response to a select signal (IDLE SEL) provided by the SSM 20, the MUX 54b will select one of the applied 7-bit inputs for communication to, and loading in, the count register 54c.

The content of the counter register 54c, in addition to being returned to the MUX 54b by one path that includes the incrementer 54d, and another that is direct, is also applied to an AND gate 54e, which provides an IDLE FULL signal when the counter register 54c reaches its maximum all ONEs count. The IDLE FULL signal is communicated to the SSM 20 which will, in response, assert the MEMORY AVAILABLE signal, and reset the RAS and CAS counters 52, 70 to initial values.

Operation of the idle counter 54 (as well as the RAS counter 52 and CAS counter 70) proceeds generally as follows: Counting is initiated by loading the idle scaler register 54a with a starting count which can be anything from ZERO to some specified count (logically, less than all ONEs). Under control of the SSM 20, i.e., the IDLE SEL signalling, the content of the idle scaler register 54a is passed through the MUX 54b to the count register 54c. When the idle counter 54 is to be incremented, the MUX 54b is then set (via the IDLE SEL signalling from the SSM 20) to receive the output of the incrementer 54d. The count register 54c receives SYSCLK, and each pulse will reload the count register 54c with the incremented value from the incrementer 54d. If, during the count, it is desired to put the counter 54 on hold, the SSM 20 will select the non-incremented output of the count register 54c so that the count remains unchanged with each SYSCLK.

Ultimately, the content of the count register 54c will reach its maximum, i.e., all ONES. This will enable the AND gate 54e to issue the IDLE FULL signal that is applied to the SSM.

As indicated above, the RAS and CAS counters 52, 70 operate in the same manner. Now, with the understanding of counter operation, the operation of the invention itself can be better understood.

At power-up, the processor unit 12 (FIG. 1) may conduct "special" access operations of the MCU 16 in order to write to certain of the registers contained therein, including the various registers of counters 52, 54 and 70. Thus, for example, the idle scaler register 54a may be written with a value from which counting is to begin. In the same fashion the RAS scaler register 52a may also be written, as well as the CAS scaler register 70a. Alternately, if desired, the various count registers 52c, 54c, 70c may be written. (7-bits of the SYSBUS can be selected for communication, by the MUX 54b and the IDLE SEL signal, to the count register 54c of the idle counter 54. Although this data path is not shown in the RAS and CAS counters 52, 70, for reasons of clarity, it will be understood that they are, in fact, present.)

Once normal operation begins, the RAS counter 52 will begin counting, in effect, each LOW to HIGH transition of the RAS signal that is generated by the RMS 22 for each memory access that requires a page change of the memory unit 14. This counting is effected in the manner described above with respect to the idle counter 54; that is, each occurrence of RAS signal will cause the SSM 20 (FIG. 4) to issue a selection signal (RAS SEL) to cause the MUX 52b to communicate the content of the counter register 52c to the input of that counter register via the incrementer 52d so that the counter register content is incremented each SYSCLK that a row change occurs (as signified by occurrence of the RAS signal).

Assume now that a number of different memory operations have been made each to a different page of the memory unit 14 (FIG. 1) than the previous one. Each page change will result in an RAS transition (e.g., rising edge) that is counted by the RAS counter 52 until the count register 52c attains its maximum count (i.e., all ONEs). This will cause the four-input AND gate 52e to issue a RAS FULL signal, indicative of attaining the maximum count. The RAS FULL signal is received by the SSM 20 which acts, in turn, to issue a THROTTLE signal that is applied to the data (D) input of a D-type flip-flop 80, causing the flip-flop to be set and issue a HOLD signal. The SSM 20 receives the HOLD signal, and responds thereto to terminate the MEMORY AVAILABLE signal.

Meanwhile, the idle counter 54 continues to count, until the counter register 54c attains its maximum count, at which time the 7 input AND gate 54e will issue the IDLE FULL to the SSM 20. IDLE FULL will cause the SSM 20 to reset the RAS counter 52, and the flip-flop 80. The SSM 20 will then re-assert the MEMORY AVAILABLE signal until the next RAS FULL signal is received. In this manner different page writes are delayed in order to prevent excessive power consumption build-up within the memory unit 14 (FIG. 1).

In the same manner, repetitive CAS transitions may be counted by the CAS counter 70.

In a further embodiment of the invention, there is provided the ability to slow down multiple back-to-back different-page memory operations for only certain types of operations such as, for example, write, read and/or the like. Accordingly, the SSM 20 is provided a five stage operation enable (OP ENABLE) register 84 that is coupled to receive the SYSBUS so that it may be written by the processor unit 12 via the special write access to the MCU 14 referred to above. That is, in the same manner that the idle, RAS, CAS scaler registers 52a, 54a, 70a may be written, so to may be the OP ENABLE register 84.

Each of the five stages of the OP ENABLE register 84 enable, when set (to a HIGH or ONE), counting RAS and/or CAS transitions for the enabled operation. The five different stages are for enabling such counting for any one, some, or all of the write (W), read (R), read-modify write (RMW), block read (BR), and block write (BW) memory operations.

Figure 5:
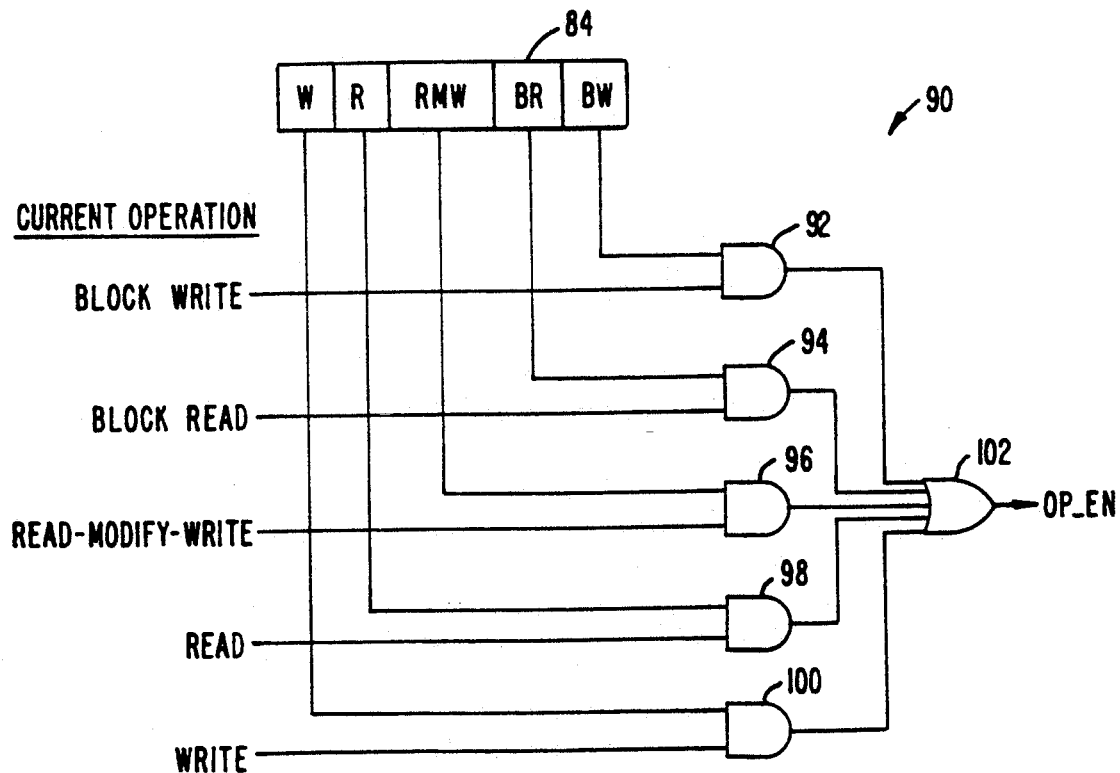
FIG. 5 is an operation enablement circuit for use with the invention shown in FIG. 4 to enable monitoring operations under certain memory operation conditions.

Turning now to FIG. 5, a combinatorial logic circuit 90 is illustrated. Combinatorial logic circuit 90 operates, in part, to perform aforementioned enable counting (of RAS, CAS, or both) operation. Each time the processor unit 12 (FIG. 1) initiates a memory operation, the SSM will develop a signal indicative of that operation. Those indicative signals are illustrated in FIG. 5 as the BLOCK WRITE, BLOCK READ, READ-MODIFY-WRITE, READ, and WRITE signalling, which are each respectively applied to corresponding ones of the AND gates 92, 94, . . . , 100. Each of these signals is ANDed with the corresponding stage of the OP ENABLE register 84. Thus, the BW, BR, RMW, R, and W stages of the OP ENABLE register 84 are respectively applied to the AND gates 92, . . . , 100. The outputs of the AND gates 92, . . . , 100 are applied to a five input OR gate 102 which produces an OP_EN signal.

The equations for forming the MUX (52b, 70a) selection (RAS, SEL, and CAS SEL, respectively) enabling RAS or CAS counters 52, 70 to increment with transitions of RAS and CAS are:

RAS SEL (INC) = RAS.$\overline{REF}$.OP_EN.
CAS SEL (INC) = CAS.$\overline{REF}$.OP_EN.

The equation forming the MUX 54b selection (IDLE SEL) to increment the idle counter 54 then, would be:

IDLE SEL (INC) = $\overline{(RAS.CAS)}$.$\overline{REF}$.

The $\overline{REF}$ signal is produced during refresh operation, when the counters, as indicated by the above equations, are disabled.

Using the enabling circuitry 90, any one or more of the identified operations can be enabled for counting RAS and CAS transitions. For example, if the W stage of the OP ENABLE register 84 is set, and the remaining stages left in a reset (i.e., LOW or ZERO) condition, the OP_EN signal would be present to cause incrementation of the RAS and CAS counters 52 and 70 only during write operations. Conversely, if the W, RMW, and BW stages are set, counting would occur during write, re-modify write, and block write operations, but not block-read or read operations.

What is claimed is:

1. In a data processing system including a processing unit and a memory system accessible to store and retrieve multi-bit data words in response to memory access requests from the processing unit, the memory system including means for providing a memory available signal indicative of capability of the memory system to honor a memory access request, the memory system being formed from an array of dynamic random access memory elements organized to include N groups of memory locations for storing multiple ones of the data words in each of the N groups, each of the N groups of memory locations being accessed by occurrence of a row address strobe signal, apparatus for limiting multiple back-to-back memory access operations to successive different ones of the N-groups of memory locations, the apparatus comprising:

counter means coupled to the memory system to receive an indication of occurrence of the row address strobe signal for providing a count of each separate one of such occurrences;
   first circuit means coupled to receive the count to inhibit provision of the memory available signal when the count matches a predetermined value; and
   second circuit means coupled to the counter means, and operable after a passage of a period of time that is initiated when the count matches the predetermined value to provide a first reset signal to cause the count of the counter means to be reset to a value other than the predetermined value.

2. The apparatus of claim 1, including means operable to provide a second reset signal to reset the counter means to a value other than the predetermined value when a memory operation is performed without occurrence of the row address strobe signal.

3. The apparatus of claim 1, wherein the apparatus forms a part of the memory system.

4. The apparatus of claim 1, wherein the memory system includes data storage means for storing and retrieving the data words and memory control means for issuing memory signals to the storage means in response to the memory access requests, and wherein the apparatus forms a part of the memory control means.

5. The apparatus of claim 1, wherein the memory access requests include at least a write data request and a read data request; the apparatus including means, coupled to the counter means, for selectively enabling the counter means to provide the count of each occurrence of the row address strobe for write data requests only.

6. In a data processing system including a processor unit coupled to a memory system for storing and retrieving multi-bit data words when a memory available signal is asserted, the memory system including means for asserting the memory available signal, the memory system being formed to store the data words in N groups of M data word memory locations, access to each of the N groups of memory locations from another of the N groups of memory locations being indicated by occurrence of a strobe signal during certain ones of the memory operations, apparatus for limiting back-to-back memory access operations to successive different ones of the N groups of memory locations, the apparatus comprising:

clock means for providing a digital clock signal;
   first counter means coupled to receive the strobe signal for developing a count of each separate one of such occurrences of the strobe signal;
   first circuit means coupled to receive the count developed by the first counter means to inhibit the memory available signal when the count of the occurrences of the strobe signal matches a predetermined value; and
   second counter means operable to count the digital clock signal for providing a first reset signal to cause the first counter means to be reset to a value other than the predetermined value.

7. The apparatus of claim 6, wherein the memory system is formed from an array of dynamic random access integrated circuit memory elements.

8. The apparatus of claim 7, wherein the strobe signal is an row address strobe signal.

9. The apparatus of claim 6, including means coupled to the first counter means for presetting the first counter means to an initial value.

10. The apparatus of claim 9, wherein the presetting means is responsive to the processor unit to preset the first counter means to the initial value.

11. The apparatus of claim 9, wherein the initial value is different from the predetermined value.

12. The apparatus of claim 8, including second circuit means operable to provide a second reset signal to reset the first counter means when a memory operation is performed without occurrence of the strobe signal.

13. In a memory system operable to respond to memory access requests to store and retrieve multi-bit data words when a memory available signal is present, the memory system including memory means having a plurality of addressable memory locations for storing, in each memory location, a multi-bit data word, the memory means being formed from an array of dynamic random access memory elements in a manner that arranges the plurality of addressable memory locations in a number of groups of addressable memory locations, access to a memory location in one of the number of groups that is different from another of the number of groups containing a last accessed memory location being indicated by occurrence of a row address strobe signal, the memory system further including clock means for providing a clock signal and memory control means for controlling the memory means for storing and retrieving data words, and for providing the row address strobe signal, apparatus for temporarily limiting successive back-to-back memory operations to different ones of the groups of memory locations, the apparatus comprising:

first circuit means for providing a first count indicative of each occurrence of the row address strobe signal, including means responsive to a reset signal to provide a second count different from the first count;

second circuit means coupled to receive the first count for providing a hold signal when the first count equals a predetermined value;

third circuit means coupled to receive the hold signal for preventing the presence of the memory available signal while the hold signal is present; and fourth circuit means responsive to the clock signal for providing the reset signal when a period of time has passed since provision of the first count has been reached.

14. The apparatus of claim 13, wherein the first circuit means includes digital counter means for counting each occurrence of the row-address strobe signal.

15. The apparatus of claim 14, wherein the digital counter means is configured to be preset with a preset value from which the counting each occurrence of the row address strobe signal begins.

16. The apparatus of claim 15, including register means for receiving and temporarily holding the preset value, the register means being coupled to provide the preset value to the digital counter means.

17. The apparatus of claim 16, including means for presetting the digital counting means with the preset value in response to the reset signal.

18. The apparatus of claim 13, wherein the memory access requests include a read-data request, for retrieving a data word, and a write data request for storing a data word, the apparatus includes operation enable means coupled to the first circuit means for selectively counting occurrences of the row address strobe signal for write data requests only.

19. The apparatus of claim 18, the fourth circuit means including means responsive to read data requests for providing the reset signal.

* * * * *